United States Patent [19]

Krug et al.

[11] Patent Number: 4,936,785
[45] Date of Patent: Jun. 26, 1990

[54] INTERCHANGEABLE ADAPTER MODULE FOR ELECTRONIC DEVICES

[76] Inventors: Eric M. Krug, 936 SW. 21st St., Loveland, Colo. 80537; Terrence A. Precht, 1645 Avondale Dr., Loveland, Colo. 80538; Bruce D. Roemmich, 913 Breakwater Dr., Fort Collins, Colo. 80525

[21] Appl. No.: 286,311

[22] Filed: Dec. 19, 1988

[51] Int. Cl.⁵ .............................................. H01R 9/09
[52] U.S. Cl. ..................................... 439/75; 361/395; 439/59
[58] Field of Search ................................ 439/59–62, 439/76, 65, 74, 75, 620; 361/394, 295, 296, 299, 412, 413, 414, 415, 401, 402

[56] References Cited

U.S. PATENT DOCUMENTS

| | | | |
|---|---|---|---|
| 2,977,562 | 3/1961 | Benson | 439/58 |
| 3,217,208 | 11/1965 | Castro | 439/59 |
| 3,668,476 | 6/1972 | Wrabel et al. | 361/413 |
| 4,331,370 | 5/1982 | Andrews et al. | 339/17 |
| 4,514,784 | 4/1985 | Williams et al. | 361/386 |
| 4,573,753 | 3/1986 | Vogl | 439/76 |
| 4,655,517 | 4/1987 | Bryce . | |
| 4,683,550 | 7/1987 | Jindrick et al. | 361/413 |
| 4,744,006 | 5/1988 | Duffield | 361/414 |
| 4,790,762 | 12/1988 | Harms et al. | 439/59 |

OTHER PUBLICATIONS

Stacked Cards Endow PC Boards, Langham, Electronics, 2-24-1982, p. 139.
IBM Technical Disclosure Bulletin, vol. 14, No. 12, pp. 3670–3671, May 1972.

Primary Examiner—Neil Abrams
Attorney, Agent, or Firm—Dorr, Carson, Sloan & Peterson

[57] ABSTRACT

An interchangeable adapter module allows a circuit board, tape cartridge system, or other add-on device to be readily interfaced with any of a variety of different computer systems. A number of pins extend perpendicularly outward from the device circuit board. An adapter circuit board having a pin connector attached thereto engages these pins to removably secure the adapter module in a plane parallel to the device circuit board. One or more external connectors attached to the adapter circuit board are then plugged into corresponding connectors of the external electronic system. Electrical interface circuitry on the adapter circuit board provides electrical interconnections between a predetermined set of the pins attached to the device, and a predetermined set of the electrical contacts of the external connectors.

2 Claims, 3 Drawing Sheets

INTERCHANGEABLE ADAPTER MODULE FOR ELECTRONIC DEVICES

BACKGROUND OF THE INVENTION

1. Field of the Invention

The present invention relates generally to the field of electrical connectors and interface adapters for electronic devices, and in particular to interchangeable adapter modules that can be used to provide an electrical interface for a circuit board, tape cartridge system, or other add-on devices in any of a variety of different computer systems.

2. Statement of the Problem

In the computer industry, a substantial "add-on" market has developed for devices and circuit boards manufactured by third parties that can be added to existing computer systems. For example, a number of manufacturers produce memory boards, disk drives, and tape backup systems that can be added to personal computers. Virtually all computer systems make provision, to some degree, for these add-on devices. Most personal computers have a number of expansion slots for this purpose, each of which have appropriate electrical connectors to interface the expansion board with the system bus and power supply. In addition, most personal computers provide a number of slots or openings in the front of the unit to house floppy disk drives, hard disk drives, or other mass storage devices such as a tape cartridge system. Each of these slots is also provided with appropriate electrical connectors to interface with the system bus and power supply. In order to function properly as part of a given computer system, an add-on device must be both physically and electrically compatible with the electrical connectors provided by the host computer system.

A problem arises due to the fact that the types of physical connectors and electrical interfaces used by various computer manufacturers for these add-on devices are different. Some computer systems use a different number of signal lines to communicate, while others use different types of connectors. For example, interfaces used in IBM personal computers are different from those used in Apple or Commodore computers. The numerous companies producing clones of IBM personal computers generally use the same interfaces as IBM to ensure complete compatibility. However, even within the IBM family of personal computers, different interfaces are used for different models. The interfaces for an IBM PS/2 computer are different from those for an IBM PC-AT, which in turn are different from those for an IBM PC or PC-XT.

Heretofore, the usual solution to this problem has been for manufacturers of add-on devices to produce a separate product customized for each type of computer system. In particular, the main circuit board of the add-on device is changed to accommodate whatever differences exist in the interface. This approach has the disadvantage of requiring a separate inventory of products and spare parts for each type of computer system, thereby resulting in higher costs for manufacturing and distributing the products. In addition, the resulting smaller volume of each product greatly reduces or eliminates any economies of scale that might otherwise be available in the manufacturing process.

3. Solution to the Problem

The present invention overcomes this problem by using a small inexpensive adapter circuit board to provide an interface for the larger, more expensive, main circuit board of the device. Given a number of these interchangeable adapters, it becomes possible to easily install the same device (including the same main circuit board) in any of a variety of different computer interface configurations.

SUMMARY OF THE INVENTION

This invention provides an interchangeable adapter module that allows a circuit board, tape cartridge system, or other add-on device to be readily interfaced with any of a variety of different computer systems.

A number of pins extend perpendicularly outward from the device circuit board. An adapter circuit board having a pin connector attached thereto engages these pins to secure the adapter module in a plane parallel to the device circuit board. One or more external connectors attached to the adapter circuit board are then plugged into corresponding connectors of the external electronic system. Electrical interface circuitry on the adapter circuit board provides electrical interconnections between a predetermined set of the pins attached to the device, and a predetermined set of the electrical contacts of the external connectors.

A primary object of the present invention is to provide a small, inexpensive, interchangeable adapter module that allows such add-on devices to be interfaced to any of a number of different computer systems, without having to change the large, expensive main circuit board of the device for each type of computer system. This allows the device to be manufactured in larger batches to allow economies of scale. In addition, the user can more easily adapt the add-on device to interface with any new configuration of computer system that may be acquired in the future.

These and other advantages, features, and objects of the present invention will be more readily understood in view of the following detailed description and the drawings.

BRIEF DESCRIPTION OF THE DRAWINGS

The present invention can be more readily understood in conjunction with the accompanying drawings, in which.

DETAILED DESCRIPTION OF THE INVENTION

Figure 1:
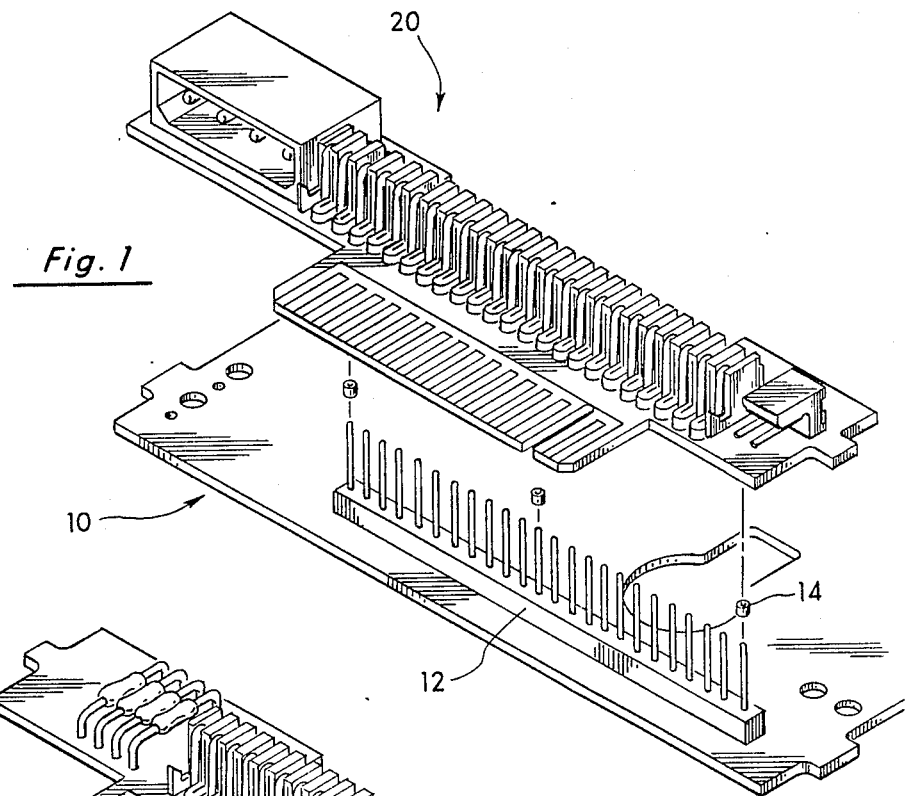
FIG. 1 is an exploded perspective view showing the adapter module and the series of pins used to attach the adapter module to the main circuit board of the device.

Turning to FIG. 1, an exploded perspective view is shown of one end of the main circuit board 10 of the add-on device, and the adapter module 20. A number of pins 12 extend perpendicularly upward from the main circuit board 10. These pins are generally arranged in a row, or series of rows, adjacent to one edge of the main circuit board. Each pin is in electrical contact with one of the input or output electrical signals of the device necessary to allow the device to function and provide an effective interface between the device and the host computer system.

Figure 2:
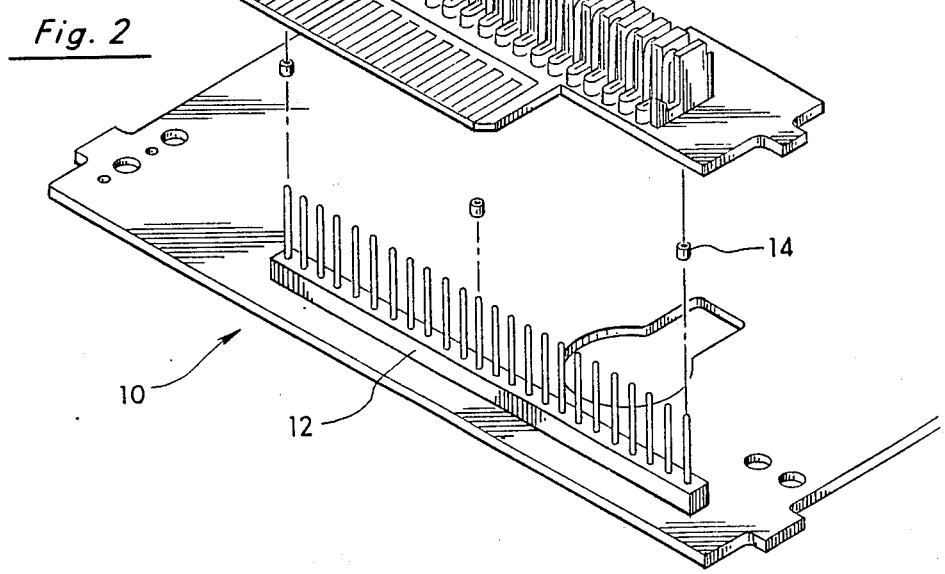
FIG. 2 is an exploded perspective view showing an alternative embodiment of the adapter module for use in association with a different type of computer system.

FIG. 2 shows an alternative embodiment of the adapter module 20 shown in FIG. 1. This is to demonstrate the readily interchangeable nature of the adapter modules 20. The main circuit board 10 and pins 12 remain the same, regardless of which adapter module is used. The adapter module 20 is installed simply by sliding it over the pins 12 extending upward from the main circuit board 10.

Figure 4:
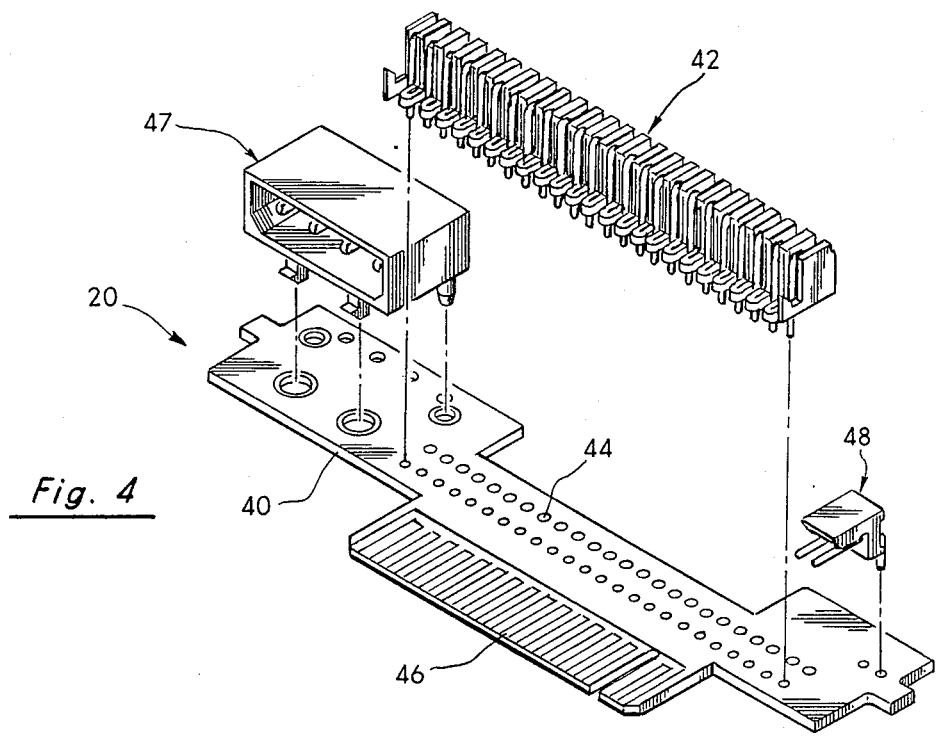
FIG. 4 is an exploded perspective view showing the adapter circuit board, pin connector, and three external connectors. This view corresponds to the adapter module shown in FIG. 1.
Figure 5:
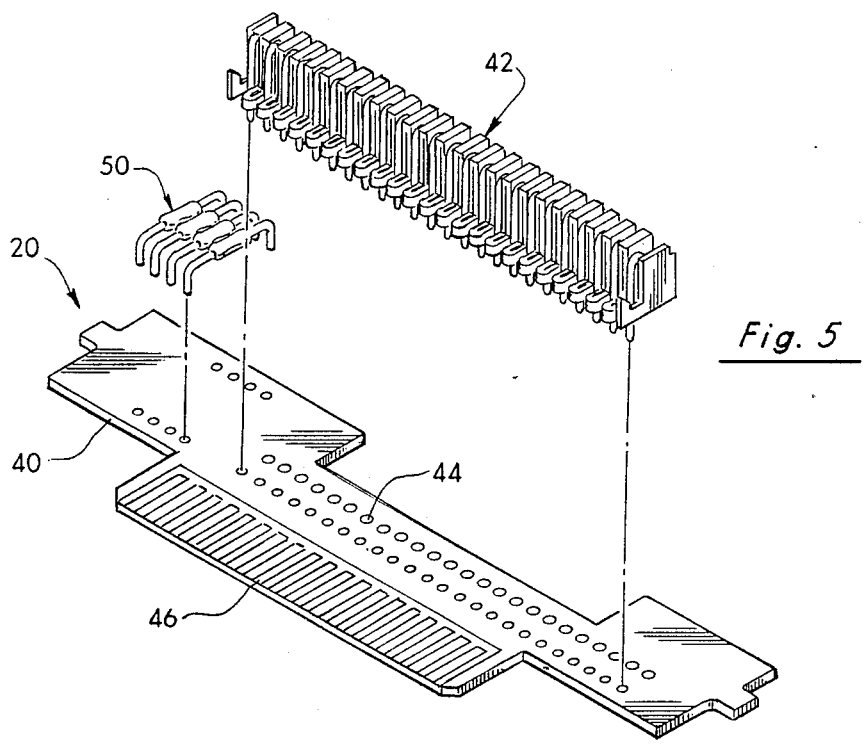
FIG. 5 is an exploded perspective view showing an alternative embodiment of the adapter circuit board with a pin connector, one external connector, and four terminating resistors. This view corresponds to the adapter module shown in FIG. 2.

FIGS. 4 and 5 are exploded perspective views of two embodiments of the adapter modules 20, corresponding respectively to FIGS. 1 and 2. The key element in both embodiments is the adapter circuit board 40 which holds all of the remaining components of the adapter module 20. This adapter circuit board 40 has a number of holes 44 arranged to match the pins 12 attached to the device circuit board 10.

A pin connector 42 is mounted to adapter circuit board 40 in alignment with the holes 44. When the adapter module 20 is attached to the device circuit board 10, the pins 12 pass through the holes 44 and are removably secured by the pin connector 42. Both the pins and pin connector are of conventional design. For example, a conventional back entry pin connector of the type available from Molex of 2222 Wellington Court, Lisle, Ill. 60532 has been found to be suitable. The back entry pin connector has a series of spring-loaded contacts that firmly hold the pins 12. The adapter circuit board 40 is thereby held in an orientation parallel to the plane of the device circuit board 10. The minimum spacing between these two circuit boards is determined by the height of the base of the pins 12. Additional spacing can be provided by including a number of spacers 14 between the circuit boards, as shown in FIGS. 1 and 2.

As shown in FIGS. 4 and 5, a number of external electrical connectors 46, 47 and 48 are attached to the adapter circuit board 40. The number and type of these external connectors for a given adapter module will be determined by the interface requirements of the host computer system. For example, the external connector 46 in FIG. 4 is one type of conventional edge connector commonly used to interface with the bus of the host computer system. An edge connector of this type generally extends outward from the adapter circuit board 40 in the plane of said adapter circuit board, with a number of electrical contacts on the upper and/or lower surfaces of the connector. The second external connector 47 is a 4-pin socket connector that can be connected to the power system of the host computer system. The third external connector 48 is a 2-pin fan connector. An alternate adapter module 20 is shown in FIG. 5 for use with IBM PS/2 personal computers in which all of the necessary electrical interface is provided by a single edge connector 46.

Electrical interface circuitry on the adapter circuit board 40 provides electrical interconnection between a predetermined set of the pins 12 and a predetermined set of the electrical contacts of external connectors 46, 47, and 48. Beyond providing simple interconnections, the interface circuitry can also provide signal processing.

FIG. 5 shows four resistors 50 intended to allow signal levels from the device to match the interface signal levels required by an IBM PS/2 computer. The interface circuitry can also provide a termination resistance to pins that are not otherwise used by the host computer's interface.

Figure 3:
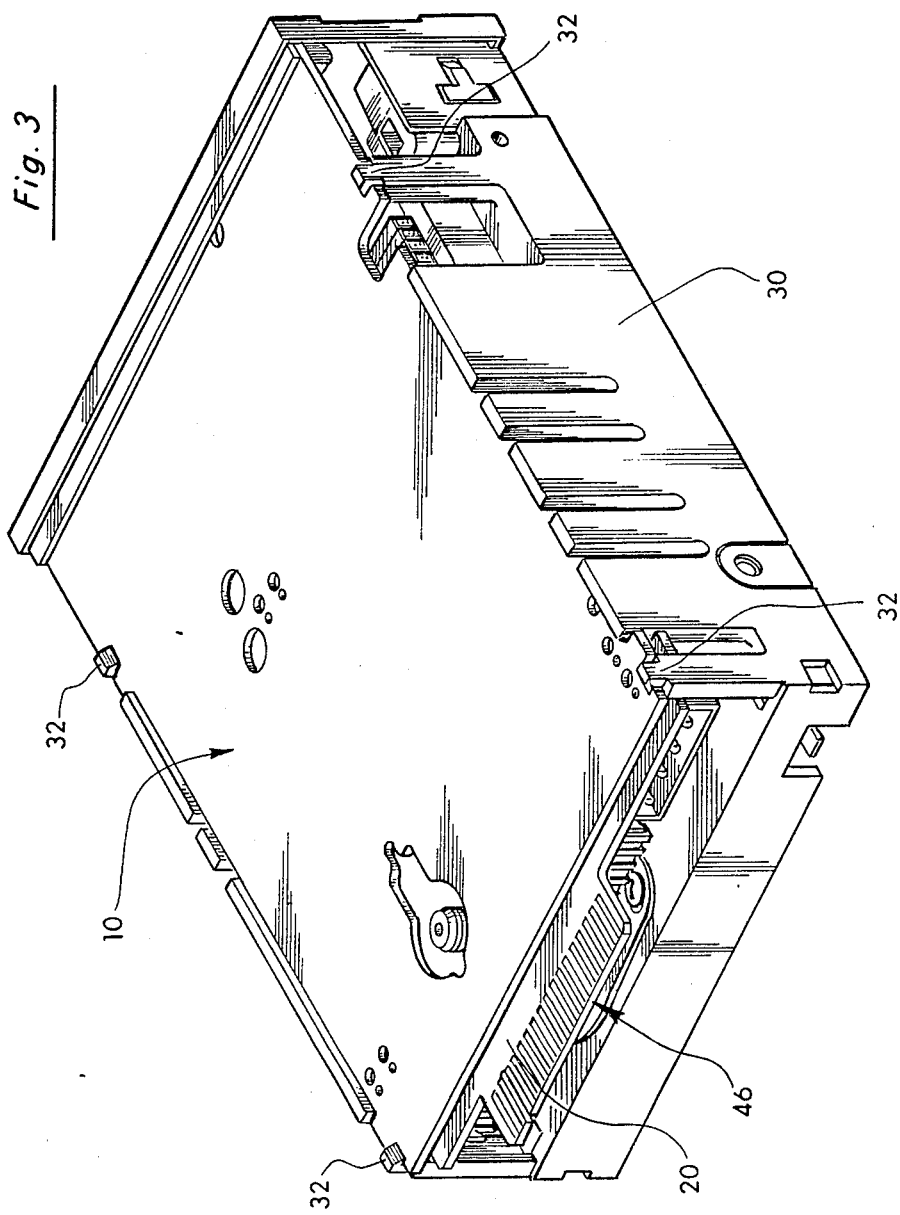
FIG. 3 is a rear perspective view showing the adapter module incorporated into a tape cartridge system.

FIG. 3 is a perspective rear view showing the adapter module 20 as assembled as part of a typical add-on device 30, such as a tape cartridge system for a personal computer. The device circuit board 10 forms the top surface of the device 30, and is held in place by a number of clips 32. This example is typical of many applications of the present invention. One edge of the device circuit board 10 extends along the back edge of the device. The pins 12 extend in a row along the back edge of the device circuit board 10 as shown in FIGS. 1 and 2. The adapter circuit board 40 is removably secured to the pins, such that the back edge of the adapter circuit board 40 is substantially in alignment with the back edge of the device circuit board. The edge connector 46 then extends beyond the back edge of the device circuit board 10. As mentioned previously, the vertical alignment of the edge connector 46 with respect to the top or bottom of the device can be fixed by inserting spacers 14 of appropriate thickness between the adapter circuit board 40 and the base of the pins 12. This configuration is particularly advantageous where the device is to be installed in one of the disk drive slots in the front of a personal computer. The device is simply inserted through the opening in the front of the computer, and the external connectors of the device are then easily connected by hand to the corresponding connectors of the computer system. In the case of an IBM PS/2 computer, the external edge connector 46 of the adapter module will automatically mate with the corresponding female edge connector of the computer as the device is inserted through the front of the computer.

The above disclosure sets forth a number of embodiments of the present invention. Other arrangements or embodiments, not precisely set forth, could be practiced under the teachings of the present invention and as set forth in the following claims.

I claim:

1. An adapter module to provide an interface between an electronic device having a circuit board, and an external electronic system having at least one connector, said adapter module comprising:
   a plurality of pins attached to said circuit board, extending perpendicularly outward from said circuit board in a number of rows adjacent to one edge of said circuit board; each of said pins in electrical contact with one of a predetermined set of electrical signals of said device;
   (b) an adapter circuit board having a number of holes adapted to permit said pins to pass through said adapter circuit board;
   (c) a pin connector attached to said adapter circuit board; suitable for removable engagement with said pins, such that said adapter circuit board can be removably secured to said device circuit board in a plane substantially parallel to the plane of the device circuit board, with a relatively small spacing separating said adapter circuit board and said device circuit board;
   (d) an external connector extending laterally outward from said adapter circuit board beyond the edge of said device circuit board adjacent to said pins, said external connector having a plurality of electrical contacts suitable for electrical connection with at least one of the connectors of said external electronic system;

(e) electrical interface circuitry on said adapter circuit board, providing electrical interconnection between a predetermined set of said pins and a predetermined set of the electrical contacts of said external connector, and providing a predetermined termination resistance to a number of said pins that are not interconnected through said interface circuitry to said external connector.

2. An adapter module to provide an interface between an electronic device having a circuit board extending along a portion of the back edge of said device, and an external electronic system having at least one connector, said adapter module comprising:

(a) a plurality of pins attached to said circuit board, extending perpendicularly outward from said device circuit board in a number of rows adjacent to the back edge of said device circuit board; each of said pins in electrical contact with one of a predetermined set of electrical signals of said device;

(b) an adapter circuit board having a number of holes adapted to permit said pins to pass through said adapter circuit board;

(c) a pin connector attached to said adapter circuit board, having spring-loaded electrical contacts that removably engage with said pins, such that said adapter circuit board can be removably secured to said device circuit board in a plane substantially parallel to the plane of the device circuit board, with a relatively small spacing separating said adapter circuit board and said device circuit board; said adapter circuit board having a back edge such that when said adapter circuit board is secured to said device circuit board, the back edge of said adapter circuit board is substantially in alignment with the back edge of said device circuit board;

(d) an external connector extending outward from the back edge of said adapter circuit board beyond the back edge of said device circuit board, said external connector having a plurality of electrical contacts suitable for electrical connection with at least one of the connectors of said external electronic system;

(e) electrical interface circuitry on said adapter circuit board, providing electrical interconnection between a predetermined set of the electrical contacts of said pin connector and a predetermined set of the electrical contacts of said external connector, and providing a predetermined termination resistance to a number of said pins that are not interconnected through said interface circuitry to said external connector.

* * * * *